United States Patent [19]

Dobler et al.

[11] 4,063,111
[45] Dec. 13, 1977

[54] SOLID STATE TOUCH SWITCH

[76] Inventors: Steve Dobler, 166-36 20 Road, Whitestone, N.Y. 11357; Christian Grund, 4219 Wickham Ave., Bronx, N.Y. 10466; Robert Fondiller, 200 W. 58th St., New York, N.Y. 10019

[21] Appl. No.: 627,973

[22] Filed: Nov. 3, 1975

[51] Int. Cl.² ............................................. H03K 13/00
[52] U.S. Cl. ................................. 307/116; 58/23 BA; 200/159 R
[58] Field of Search ............... 58/23 R, 23 D, 50 R; 200/159 R, DIG. 1, DIG. 2; 307/116, 308

[56] References Cited

U.S. PATENT DOCUMENTS

| 3,737,670 | 6/1973 | Larson | 307/116 |
|---|---|---|---|
| 3,742,699 | 7/1973 | Bergey | 58/50 R |
| 3,805,086 | 4/1974 | Larson et al. | 307/116 |
| 3,862,432 | 1/1975 | Larson | 307/116 |
| 3,879,618 | 4/1975 | Larson | 307/116 |
| 3,909,625 | 9/1975 | Colglazier et al. | 307/116 |
| 3,983,690 | 10/1976 | McClintock | 58/50 R |
| 3,991,329 | 11/1976 | Inasa et al. | 307/308 |

OTHER PUBLICATIONS

"Build the Touch Control", Popular Electronics, 4/1969, L. G. Striggow, pp. 57-58.
"Electronics Experimenters Circuit Manual;" 1971, pp. 141-145.
IBM Technical Disclosure Bulletin, 4/71, "Push Button Switch w/no Moving Parts".

Primary Examiner—Robert K. Schaefer
Assistant Examiner—Vit W. Miska

[57] ABSTRACT

A solid state touch switch is provided, in which, during use, a portion of the user's body, such as a finger, forms a portion of an electronic circuit to change the state of a solid state electronic device and thereby actuate the solid state touch switch. Alternative embodiments of the invention contemplate the use of various solid state electronic devices including metal-oxide semiconductor field-effect transistors (MOSFET'S) junction field effect transistors, silicon controlled rectifiers and NPN transistors. One application of the solid state touch switch is in a digital watch in which a user touches a contact pad located on the watch case and thereby turns the digital watch on for the display of time and date signals.

2 Claims, 26 Drawing Figures

FIG 5, FIG 6, FIG 7, FIG 8, FIG 9, FIG 10

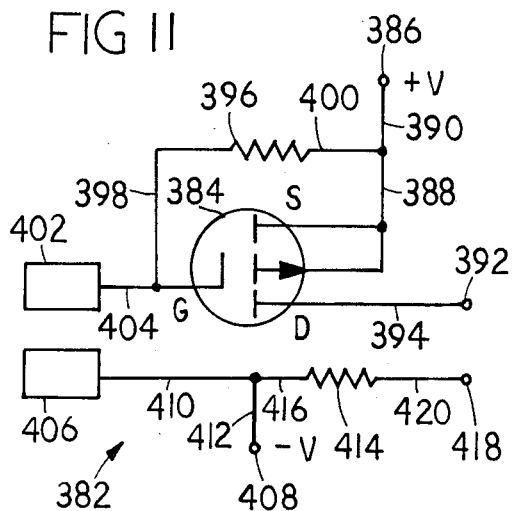
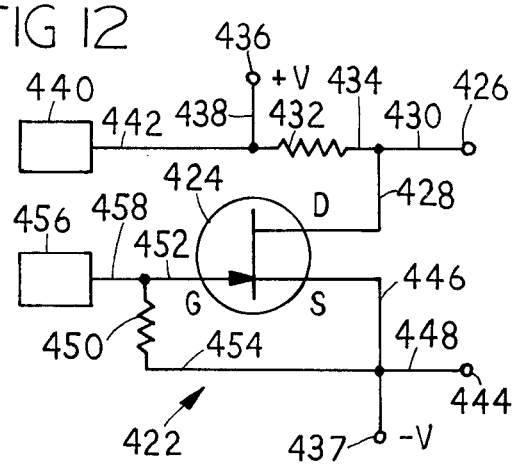
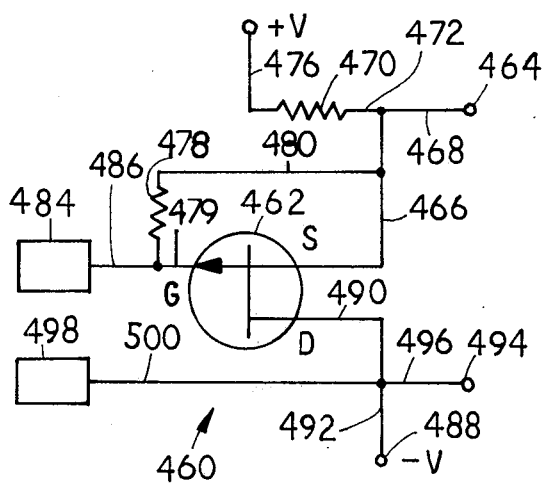
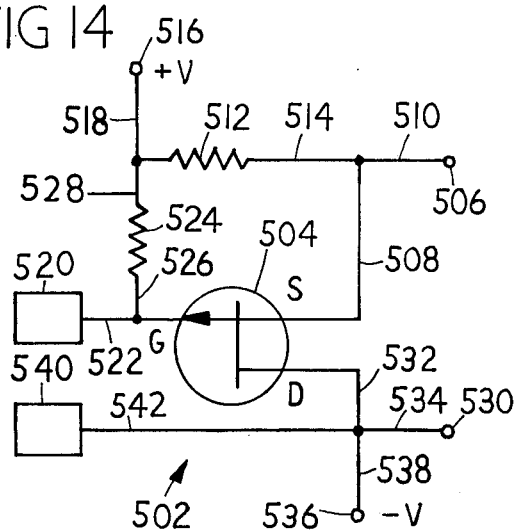

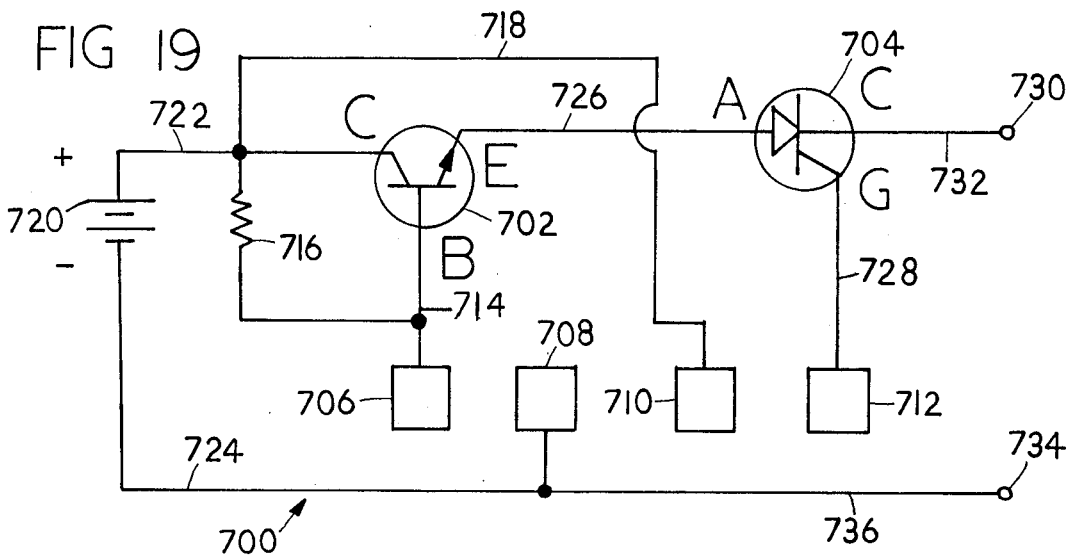
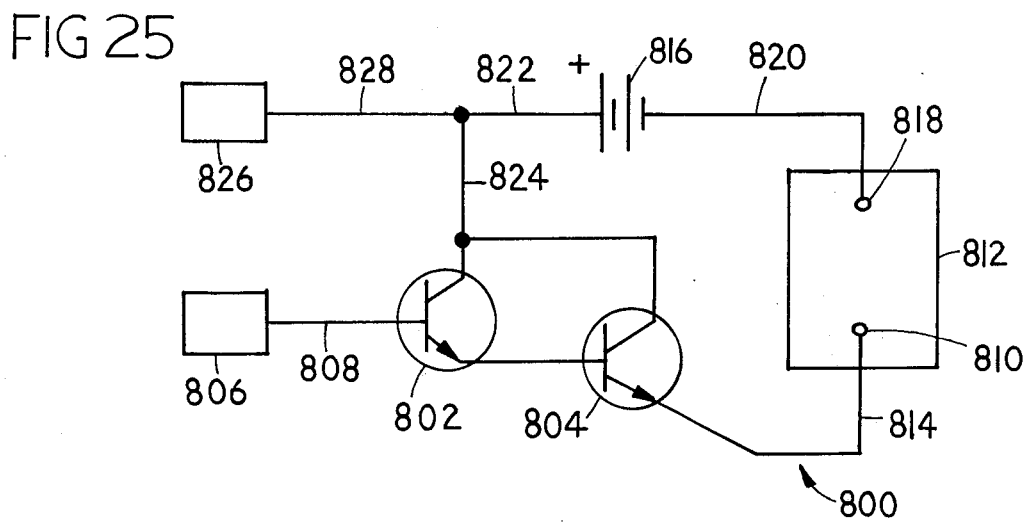
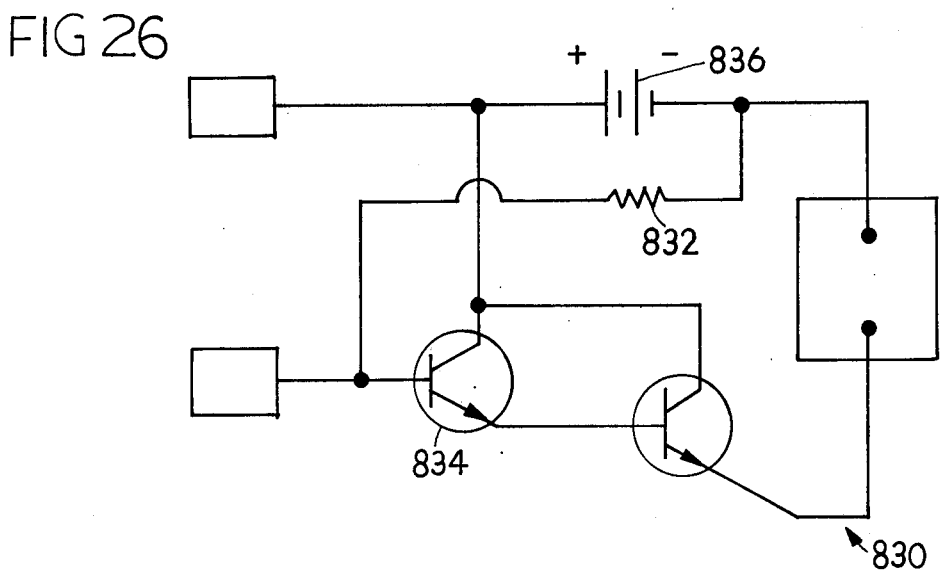

SOLID STATE TOUCH SWITCH

BACKGROUND OF THE INVENTION

The present invention relates in general to solid state switches and more particularly to a solid state switch which is operated by touch.

BACKGROUND OF THE INVENTION

Conventional digital watches incorporate a mechanical switch to enable a display device, such as a light emitting diode type display, to display a time or date signal which is generated by an integrated circuit watch chip. Mechanical switches used in this application are subject to a number of problems which can cause operating difficulties over a period of time. Included among these problems are: wear of the moving mechanical switch components; oxidation of the switch contacts, unless plated with rare and costly metals; fatigue of the spring element used to provide a restoring force in the mechanical switch; and accumulation of dust particles in the mechanical switch, which, in time, can interfere with the normal operation of the switch. As a result of the above problems the generally lower reliability of the mechanical switch degrades the generally higher reliability of the integrated circuit watch chip, thus resulting in an overall product reliability which is lower than desired. In addition, mechanical switches for digital watch applications generally require relatively closely machined components and at least one resilient seal to render the switch waterproof. A failure of the resilient seal can result in a degradation of the ability of the mechanical switch to seal against moisture entering the interior of the watch case thus leading to possible damage of the digital watch. Mechanical switches for digital watches also conventionally require the use of a button which projects from the watch case and this detracts from the overall esthetic appearance of the digital watch.

SUMMARY OF THE INVENTION

In order to overcome the problems of the prior art, there is provided, in accordance with the present invention, a solid state switch which may be used for controlling a digital watch and which operates on the novel principal of using a portion of the body of the user as a circuit element. In a first embodiment of the invention, the solid state switch includes a watch case, which is made of a conductive material and which contains an integrated circuit watch chip which incorporates time keeping and date keeping circuitry. The watch chip has a plurality of terminals, two of which are known as the VSS terminal and the demand terminal. In a conventional digital watch these terminals are connected to the switch contacts of a normally open mechanical switch. In contrast to the above, in accordance with the present invention, the VSS terminal is connected electrically to the watch case and to the watch battery and the demand terminal is connected electrically to a relatively small touch pad which is set slightly underflush on an outer surface of the watch case and which is insulated electrically from the watch case. In use, the wearer simply places a finger on the touch pad thus touching the touch pad and the watch case simultaneously. The watch chip and the finger of the wearer form a circuit which is sufficiently sensitive to activate the watch chip for the display of a time or date signal. The touch pad being set slightly underflush with the surface of the watch case prevents unwanted activation of the solid state switch due to accidental contact with the touch pad. The touch pad and the watch case form a waterproof assembly which is not subject to degradation or leakage.

In an alternative embodiment of the invention, additional switch sensitivity is achieved through the incorporation in the watch case of a switch circuit which includes a metaloxide-semiconductor field-effect transistor or MOSFET. The MOSFET is connected in the circuit in a manner such that the application of a finger to the touch pad and the watch case changes the conductivity of the MOSFET and thus activates the watch chip for the display of time or date signals.

In another embodiment of the invention, a solid state switch is provided which incorporates a MOSFET and in which the application of a finger of the user to a pair of touch pads closes a circuit which changes the conductivity of the MOSFET thus serving to close an electrical connection between two switch terminals. This solid state switch can be used in a broad range of applications, wherever a minature solid state switch, activated by finger contact is desired.

In still another embodiment of the invention, a junction field-effect transistor or JFET is used to provide a normally off-type switch which is similarly activated by finger contact with a pair of touch pads.

In another embodiment of the invention, a solid state switch is provided which incorporates a MOSFET to provide a normally-on-type switch which is turned off by the application of a finger of the user to a pair of touch pads.

In another embodmennt of the invention, a solid state switch is provided which incorporates a NPN transistor and a silicone controlled rectifier, SCR, to provide a touch-on, touch-off switch having two pairs of contacts. The switch is turned on by the application of a finger of a user to the first pair of contacts and is turned off by the application of a finger of the user to the second pair of contacts.

In still another embodiment of the invention, a solid state switch is provided which incorporates a printed circuit board having a plated edge portion and a contact rod projecting from the plated edge portion and passing through a case for contact by a user. The contact rod is insulated from the case and the plated edge portion is disposed on a recessed portion of the printed circuit board and is thus prevented from making unwanted contact with the case.

It is an object of the present invention to provide a solid state switch which utilizes a portion of the body of the user as a switch element.

Another object of the present invention is to provide a solid state switch for controlling a digital watch which can be activated by touching a touch pad located on the watch case with a finger.

Another object of the present invention is to provide a miniature solid state switch which is activated by contact with a portion of the user's body and which incorporates a field-effect transistor circuit.

Another object of the present invention is to provide a solid state switch for controlling a digital watch which is waterproof.

Another object of the present invention is to provide a minature solid state switch which can be easily manufactured in quantity at a relatively low unit cost.

Another object of the present invention is to provide a solid state touch-on, touch-off switch having two pairs of contacts, which is turned on by a user touching the first pair of contacts, and which is turned off by a user touching the second pair of contacts.

Still another object of the present invention is to provide a solid state switch incorporating a printed circuit board having a plated edge portion formed in a recessed portion of the printed circuit board.

Additional objects and advantages of the invention will become apparent during the course of the following specification, when taken in connection with the accompanying drawings, in which:

BRIEF DESCRIPTION OF THE DRAWINGS

FIG. 5 is a circuit diagram of an alternative emodiment of the solid state switch of FIG. 1 incorporating an N channel, enhancement mode, MOSFET which applies a positive pulse to the watch chip;

FIG. 6 is a circuit diagram of an alternative embodiment of the solid state switch of FIG. 1 incorporating a P channel, enhancement mode, MOSFET which applies a positive pulse to the watch chip;

FIG. 7 is a circuit diagram of an alternative embodiment of the invention in which a solid state switch has a pair of normally open switch contacts which are closed electrically when a pair of touch pads are contacted by a user's fingers;

FIG. 8 is a circuit diagram of an alternative embodiment of the solid state switch of FIG. 7 incorporating a P channel enhancement mode MOSFET;

FIG. 9 is a circuit diagram of an alternative embodiment of the solid state switch of FIG. 8;

FIG. 10 is a circuit diagram of an alternative embodiment of the solid state switch of FIG. 7 in which the solid state switch incorporates an N channel depletion mode MOSFET and the solid state switch is normally on;

FIG. 11 is a circuit diagram of an alternative embodiment of the solid state switch of FIG. 7 in which the solid state switch incorporates a P channel, depletion mode, MOSFET and the solid state switch is normally on;

FIG. 12 is a circuit diagram of an alternative embodiment of the solid state switch of FIG. 7 incorporating an N channel junction field-effect-transistor;

FIG. 13 is a circuit diagram of an alternative embodiment of the solid state switch of FIG. 7 incorporating a P channel junction field-effect transistor;

FIG. 14 is a circuit diagram of an alternative embodiment of the solid state switch of FIG. 13;

FIG. 19 is a circuit diagram of a touch-on, touch-off solid state switch according to the present invention;

FIG. 25 is an alternative embodiment of the solid state swtich of FIG. 1 incorporating a pair of NPN transistors;

FIG. 26 is an alternative embodiment of the solid state switch of FIG. 25 incorporating a resistor for modification of switch sensitivity.

DETAILED DESCRIPTION OF THE INVENTION

Figure 1:
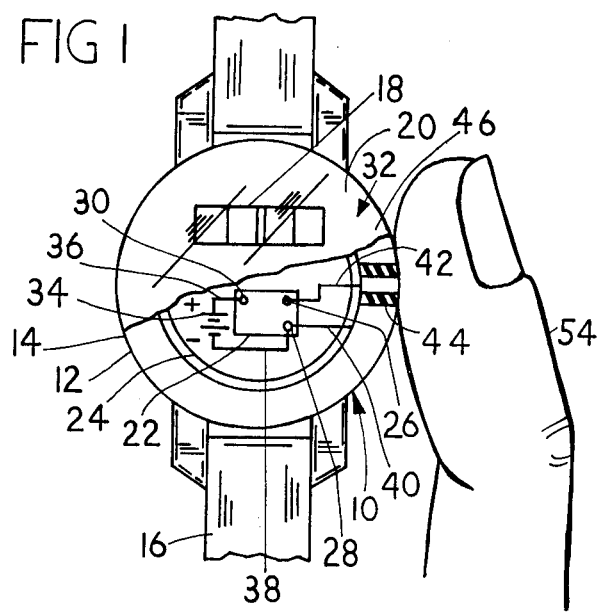
FIG. 1 is a partial top view of an electronic digital watch incorporating a solid state switch made in accordance with the present invention.

Referring in detail to the drawings, there is shown in FIG. 1 a preferred embodiment of a solid state switch 10 made in accordance with the present invention. The solid state switch 10 is shown incorporated by way of example in a digital watch 12 which comprises a watch case 14 to which a watch band 16 is attached. A digital display device 18 is mounted on the watch case cover 20 and an integrated circuit watch chip 22 is mounted on a substrate 24 located within the watch case H. The integrated circuit watch chip 22 is in the nature of a large scale integrated circuit chip which provides digital time keeping and date keeping capability. This integrated circuit watch chip 22 includes a demamd switch terminal 26, a VSS terminal 28 and a supply terminal 30. The digital watch 12 incorporates an electronic circuit generally indicated by the numeral 32 which comprises a power source 24 which, by way of example, may comprise a pair of 11/2 volt wristwatch batteries, connected in series to provide a nominal 3 volt power supply to the integrated circuit watch chip 22. Lead 36 connects the supply terminal 30 to the positive side of the power source 34 and lead 38 connects the VSS terminal 28 to the negative side of the power source 34. In a conventional digital watch, the demand switch terminal 26 and the VSS terminal 28 are connected by a normally-open mechanical switch. In contrast to the above, lead 40 connects to the VSS terminal 28 to the watch case 14 which is made of an electrically conductive material and lead 42 extends from the demand switch terminal 26, through an insulating sleeve 44 which is mounted in the side 46 of the watch case 14. The end 48 of the lead 42 is flush with the surface 50 of the insulating sleeve 44 and the surface of the insulating sleeve 44 is set slightly underflush relative to the surface 52 of the watch case 14.

In operation, the user simply touches the surface 48 of the lead 42 with his finger 54. The user's finger simultaneously touches the surface 52 of the watch case 14, as is shown in FIG. 1, and thus the resistance of the finger 54 is introduced between the VSS terminal 28 and the demand switch terminal 26 of the integrated circuit watch chip 22. The electronic circuit 32 thus formed is sufficiently sensitive to activate the integrated circuit watch chip 22 to display the time and the date signals on the display device 18.

Placing the end 48 of the lead 42 and the surface 50 of the insulating sleeve 44 slightly underflush with the surface 52 of the watch case 14 prevents accidental turn on of the digital watch 10. The end 48 of the lead 42, the insulating sleeve 44 and the watch case 14 form a sealed touch pad assembly which prevents the entrance of moisture into the watch case 14. It is clear that alternatively, the connections to the power source 34 may be reversed to provide a positive pulse to the demand terminal 26 for an alternative integrated circuit watch chip requiring a positive pulse for turn-on.

Figure 2:
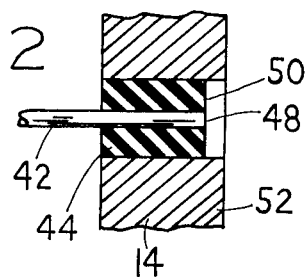
FIG. 2 is an enlarged partial sectional view of the touch pad of the solid state switch of FIG. 1.
Figure 3:
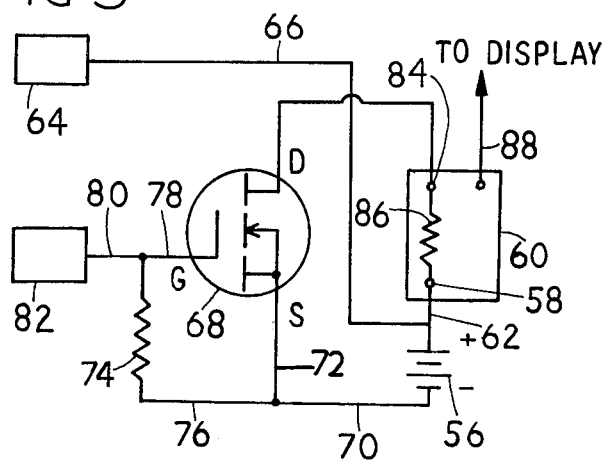
FIG. 3 is a circuit diagram of an alternative embodiment of the solid state switch in FIG. 1 incorporating an N channel, enhancement mode, MOSFET.
Figure 16:
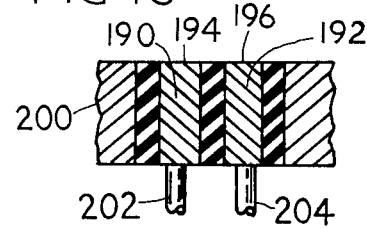
FIG. 16 is a cross-sectional view taken along the line 16—16 of FIG. 15.

In the embodiment of the invention shown in FIG. 3, a field-effect-transistor of a type known as a metal-oxide-semiconductor field-effect transistor (MOSFET) or insulated-gate field-effect transistor (IGFET) is utilized in a solid state switch circuit. The MOSFET shown in FIG. 3 is an N channel enhancement mode device and the terminals of the MOSFET in FIG. 3 and in the following FIGS. 4 through 14 are denoted, in the conventional manner, with the letter D indicating the drain terminal, the letter S indicating the source terminal, and the letter G indicating the gate terminal. In FIG. 3 the positive side of the power source 56 is connected to the supply terminal 58 of the integrated circuit watch chip 60 via the lead 62 and to the watch case 14, which is shown schematically as the rectangle 64 via lead 66. The negative side of the power source 56 is connected to the source terminal S of the N channel enhancement mode MOSFET 68, via the leads 70 and 72. A resistor 74 is connected across the gate terminal, G, and the source terminal, S, of the N channel enhancement mode MOSFET 68 via the leads 76 and 78. The resistor 74 is also connected to the touch pad arrangement shown in FIG. 2 via the lead 80 with the rectangular 82 schematically representing the surface 48 of the lead 42 which is the contact surface. The resistance value of the resistor 74 may be, by way of example, in the order of 20 meg ohms. The drain terminal, D, of the N channel enhancement mode MOSFET 68 is connected to the demand terminal 84 of the integrated circuit watch chip 60 and the resistor 86 represents an internal resistor of the integrated circuit watch chip 60. The integrated circuit watch chip 60 is connected to the display device 18 via the lead 88.

In operation, when the digital watch 10 is off, the gate, terminal, G, and the source terminal, S, of the N channel enhancement mode MOSFET 68 are each at a potential of approximately −3 volts. When a finger is placed on the touch pad, FIG. 2, thus connecting the watch case 64 and the lead 80, the resistance of the finger forms a series connection with the resistor 74. The potential across the combination of the finger resistance and the resistor 74 divides across each of these two resistances in proportion to the individual value of these resistances. The resistance of the finger, allowing for variations in the skin resistance of individual users, variations in skin moisture and variations in contact pressure, is in the order of one-twentieth of the resistance of the resistor 74. The voltage on the gate terminal G, of the N channel enhancement mode MOSFET 68 becomes positive and the N channel enhancement mode MOSFET 68 switches to a conductive mode causing current to flow through the internal or lead resistor 86 thus activating the integrated circuit watch chip 60 for the display of time and date signals which flow through the lead 88. The resistor 74 serves also to prevent unwanted turn-on of the digital watch 10 due to electrical noise which may be inadvertently imposed on the leads 78 and 80 and provides a path for static charges which may build up on the gate terminal G, to lead off. The resistor 74 also prevents possible damage to the N channel enhancement mode MOSFET 68 resulting from static charges which may be inadvertently imposed on the leads 78 and 80. The value of the resistor 74 may be changed in order to achieve a switch of different sensitivity. As the value of the resistor 74 is increased the sensitivity of the switch circuit of FIG. 3 is increased, that is, the integrated circuit watch chip 60 can be turned on with a higher value of resistance placed across the surface 48 and the watch case 14.

Figure 4:
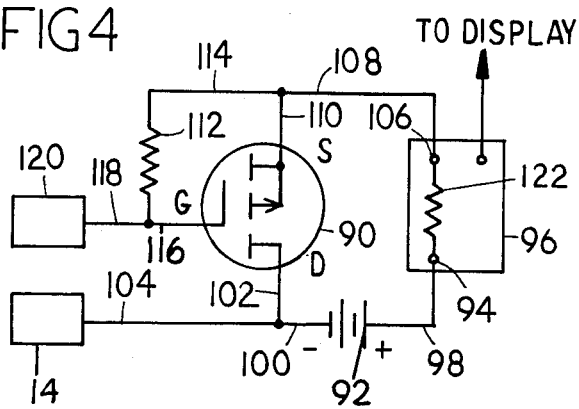
FIG. 4 is a circuit diagram of an alternative embodiment of the solid state switch of FIG. 1 incorporating a P channel, enhancement mode, MOSFET.

In the alternative embodiment of the invention shown in FIG. 4 a P channel enhancement mode MOSFET 90 is used. The positive side of the power source 92 is connected to the supply terminal 94 of the integrated circuit watch chip 96 via lead 98 and the negative side of the power source 92 is connected to the drain termina, D, of the P channel enhancement mode MOSFET 90 via leads 100 and 102. The drain terminal, D, is also connected to the watch case 14 via the lead 104. The demand terminal 106 of the integrated circuit watch chip 96 is connected to the source terminal, S, of the P channel enhancement mode MOSFET 90 via the leads 108 and 110. A resistor 112 is connected across the source termina, S, and the gate terminal, G, of the P channel enhancement mode MOSFET 90 via the leads 114 and 116, respectively and the resistor 112 is also connected to the touch pad arrangement of FIG. 2 via the lead 118 with the rectangle 120 schematically representing the contact surface 48 of the lead 42.

In operation, when a finger is placed touching the surface 48 and the watch case 14, the potential on the gate terminal, G, becomes negative and the P channel enhancement mode MOSFET 90 switches to the conductive mode, permitting current to flow through the internal resistor 122 in the integrated circuit watch chip 96 and thus activating the integrated circuit watch chip 96 for the display of time and date signals in a manner similar to that described above.

In the enbodiments shown in FIGS. 3 and 4 the integrated circuit watch chips 60 and 96 are activated by the application of a negative pulse to the demand terminals 84 and 106, respectively. In two additional embodiments shown in FIGS. 5 and 6 an integrated circuit watch chip is activated by the application of a positive pulse to the demand terminal.

Figures 5, 6, 7, 8, 9, 10:
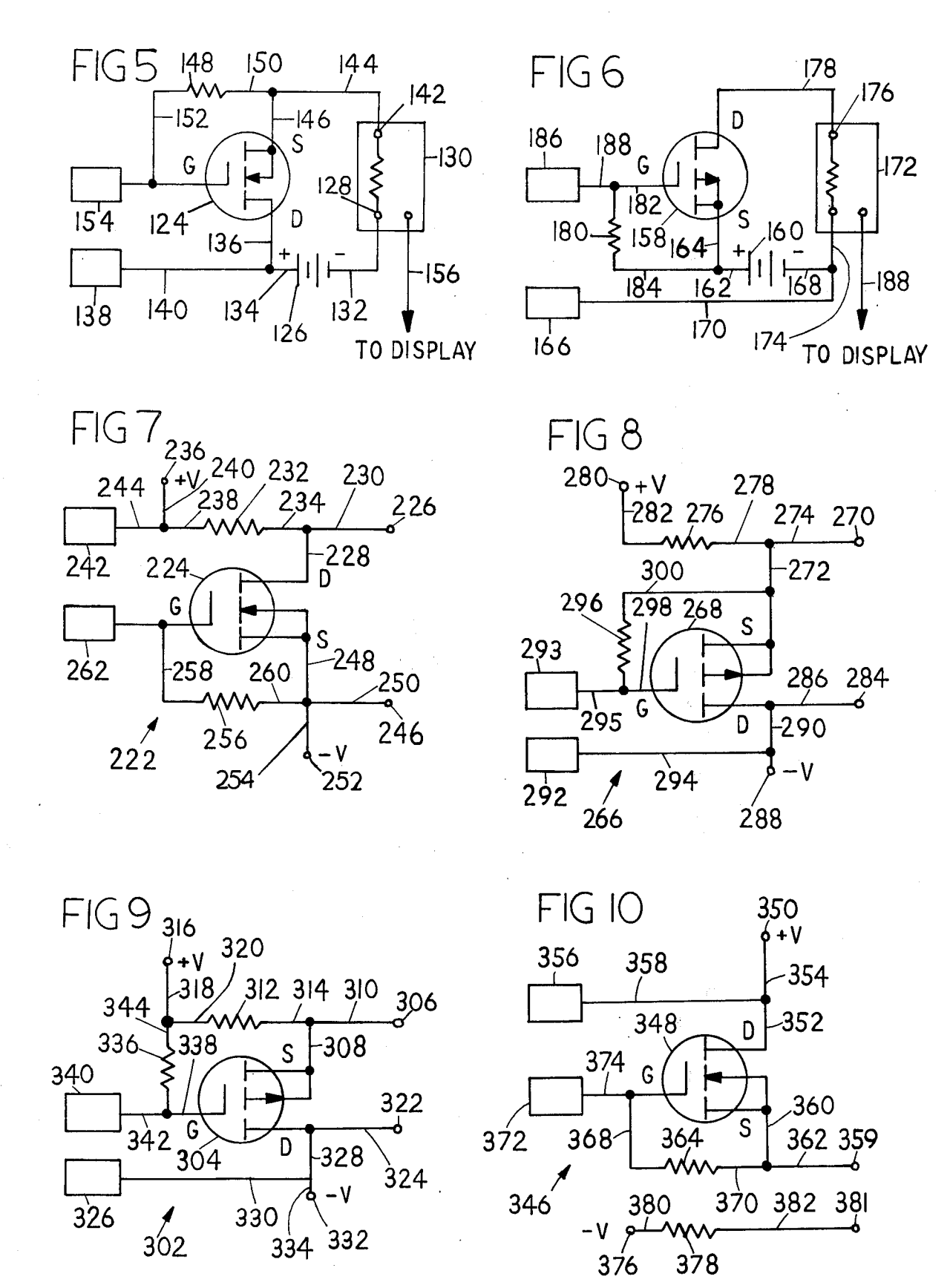

In the alternative embodiment shown in FIG. 5 an N channel enhancement mode MOSFET 124 is used. The negative side of the power source 126 is connected to the supply terminal 128 of the integrated circuit watch chip 130 via lead 132 and the positive side of the power source 126 is connected to the drain terminal, D, of the N channel enhancement mode MOSFET 124 via leads 134 and 136. The positive side of the power source is also connected to the watch case 14 which is shown schematically as the rectangle 138 via the lead 140. The demand terminal 142 of the integrated circuit watch chip 130 is connected to the source terminal, S, of the N channel enhancement mode MOSFET 124 via the leads 144 and 146. Resistor 148 is connected across the source terminal, S, and the gate terminal, G, of the N channel enhancement mode MOSFET 124 via the leads 150 and 152, respectively. The gate terminal, G, is also connected to the surface 48 of FIG. 2 which is shown schematically as the rectangle 154 via the lead 155.

In operation, when a finger is placed touching the surface 48 and the watch case 14 the potential on the gate terminal, G, of the N channel enhancement mode MOSFET 124 becomes positive and the N channel enhancement mode MOSFET 124 switches from a non-conductive mode to a conductive mode thus applying a positive pulse to the demand terminal 142 of the integrated circuit watch chip 130. The integrated circuit watch chip 130 is thus activated for the display of time and date signals which flow through the lead 156.

In the alternative embodiment shown in FIG. 6 a P channel enhancement mode MOSFET 158 is used. The positive side of the power source 160 is connected to the source terminal, S, of the P channel enhancement mode MOSFET 158 via leads 162 and 164. The negative side of the power source 160 is connected to the watch case 14 which is represented schematically by the rectangle 166 via the leads 168 and 170, and to the integrated circuit watch chip 172 via the lead 174. The drain terminal, D, of the P channel enhancement mode MOSFET 158 is connected to the demand terminal 176 of the integrated circuit watch chip 172 via the lead 178. The resistor 180 is connected across the gate terminal, G, and the source terminal, S, of the P channel enhancement mode MOSFET 158 via the leads 182 and 184, respectively, and the gate terminal, G, is also connected to the surface 48 of FIG. 2 which is shown schematically as rectangle 186, via the lead 188.

In operation, when a finger is placed touching the surface 48 and the watch case 14 the potential on the gate terminal, G, is changed from positive to negative and the P channel enhancement mode MOSFET 158 switches to a conductive mode thus applying a positive pulse to the demand terminal 176 of the integrated circuit watch chip 172. The integrated circuit watch chip is 172 thus activated for the display of time and date signals which flow through the lead 188.

In the embodiments shown in FIGS. 7 through 14 the concepts of the present invention are directed to the provision of a touch operated miniature solid state switch which may be used in a broad range of applications which are not restricted to the operation of digital watches. The touch operated miniature switches according to the present invention are characterized by the use of field-effect transistors in a manner similar to that shown with the additional feature that in addition to the use of metal-oxide-semiconductor field-effect transistors (MOSFET's), junction field-effect transistors (JFET's) are also used in alternative circuits. Circuit configurations for normally-on type switches as well as for normally-off type switches are provided. The touch operated miniature switches according to the invention feature the use of four terminals, two of which are designated +V and −V in FIGS. 7 through 14 and which, in use, are connected to a power source, which is not shown, for provision of power to operate the field-effect transistor in a manner to be presently described. In contrast to the touch pad arrangement of FIG. 2 the touch operated miniature solid state switches of FIGS. 7 through 14 feature the use of the touch pad arrangements shown in FIGS. 15, 16, 17 and 18 each of which feature a pair of contact pads.

Figure 15:
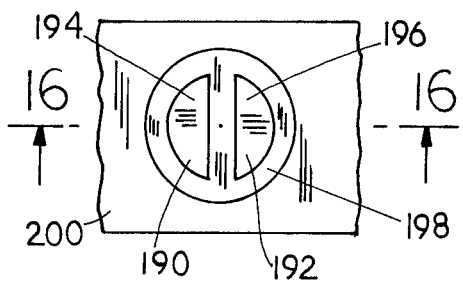
FIG. 15 is a partial top view of a touch pad assembly for use with the solid state switch of FIG. 7.

The contact pads 190 and 192 shown in FIG. 15 each have a semi-circular contact surface 194 and 196 and are set in an insulating member 198 which electrically insulates the contact pads, 190 and 192 from each other and from the substrate 200 in which they are mounted. The contact pads 190 and 192 are connected to leads 202 and 204, respectively, which are connected to various alternative circuits in a manner to be presently described. It is to be understood that in the event that the substrate 200 is made of a non-conductive material, the contact pads 190 and 192 may be set directly in the non-conductive substrate without the use of the insulating member 198. Such an arrangement may be used in lieu of the contact pad arrangement of FIG. 2, in the event that the watch case 14 is made of plastic. Although the contact pads 190 and 192 are shown relatively close together by way of example, it will be understood that the values of the electrical components in the circuits, which will be presently described, may be chosen to provide a variety of switch sensitivities so that the contact pads 190 and 192 may be spaced close together, as shown, for simultaneous contact of both contact pads 190 and 192 by a single finger or the contact pads 190 and 192 may be spaced relatively far apart for contact of one of the user's hands on each of the contact pads 190 and 192 thus applying a resistance path between the contact pads 190 and 192 which comprises the sum of the resistances of both of the operator's hands, his arms and his torso.

Figure 17:
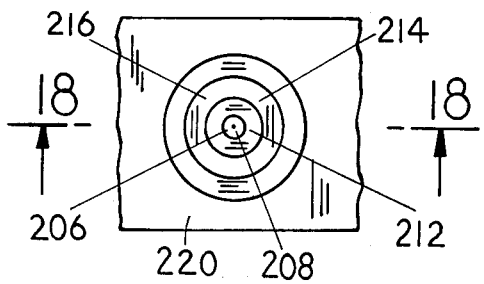
FIG. 17 is a partial top view of an alternative touch pad assembly for use with the solid state switch of FIG. 7.
Figure 18:
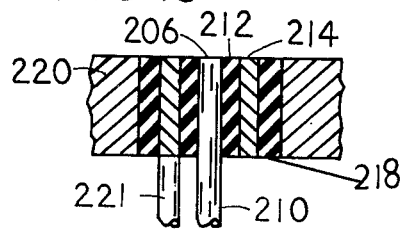
FIG. 18 is a cross-sectional view taken along the line 18—18 of FIG. 17.

An alternative arrangement of contact pads is shown in FIGS. 17 and 18 with the inner contact pad 206 having a circular contact surface 208 which is an extension of lead 210 which passes through the inner insulating member 212. The outer contact pad 214 has a ring shaped contact surface 216 and encircles the inner insulating member 212. An outer insulating member 218 encircles the outer contact pad 214 and insulates it from the substrate 220. The outer contact pad 214 is connected to lead 221.

In the circuit diagram of FIG. 7 a touch operated solid state switch 222 is shown incorporating an N channel enhancement mode MOSFET 224. The drain terminal, D, of the N channel enhancement mode MOSFET 224 is connected to the first switch terminal 226 via leads 228 and 230 and to a resistor 232 via lead 234. The resistor 232 is connected to the +V terminal 236 via leads 238 and 240 and to the contact pad 192 of FIG. 15, which is shown schematically as the rectangle 242 via lead 244. The source terminal, S, of the N channel enhancement mode MOSFET 224 is connected to the second switch terminal 246 via the leads 248 and 250 and to the −V terminal 252 via the lead 254. The resistor 256 is connected across the gate terminal, G, and the source terminal, S, of the N channel enhancement mode MOSFET 224 via the leads 258 and 260, respectively. The gate terminal, G, is also connected to the contact pad 194 of FIG. 15, which is shown schematically as the rectangle 262, via the lead 264.

In operation, the touch operated solid state switch 222 is normally-off, the gate terminal, G, is at a negative potential and there is little or no conductivity between the drain terminal, D, and the source terminal, S, and consequently little or no conductivity between the switch terminals 226 and 246. When the contact pads 190 and 192 are touched simultaneously by an operator the potential on the gate terminal, G, becomes positive thus increasing the conductivity between the drain and source terminals and turning the touch operated solid state switch 222 on. By way of example, the resistance value of the resistor 232 may be in the order of 10 to 100

K ohms and the value of the resistor 256 may be in the order of 20 meg ohms.

In an alternative embodiment of the touch operated solid state switch 222, which is not shown resistor 232 can be eliminated and replaced by the load resistance of the device that is to be turned on. The switch terminal 246 in this embodiment would be moved from the location shown in FIG. 7 to the lead 238.

In the circuit diagram of FIG. 8 a touch operated solid state switch 266 is shown incorporating a P channel enhancement mode MOSFET 268. The source terminal, S, of the P channel enhancement mode MOSFET 268 is connected to a first switch terminal 270, via leads 272 and 274, and to a resistor 276 via lead 278. The resistor 276 is connected to the +V terminal 280 via the lead 282. The drain terminal, D, of the P channel enhancement mode MOSFET 268 is connected to a second switch terminal 284 via lead 286, to the −V terminal 288 via lead 290 and to the contact pad 192 of FIG. 15 which is shown schematically as the rectangle 292 via the lead 294. The resistor 296 is connected across the gate terminal, G, and the source terminal, S, of the P channel enhancement mode MOSFET via the leads 298 and 300, respectively. The gate terminal G is also connected to the contact pad 192 of FIG. 15 which is shown schematically as the rectangle 293 via the lead 295.

In operation, the touch operated solid state switch 266 is normally-off, the gate terminal, G, is at a positive potential and there is little or no conductivity between the drain terminal, D, and the source terminal, S, and consequently little or no conductivity between the switch terminals 270 and 284. When the contact pads 190 and 192 are touched simultaneously by an operator, the potential on the gate terminal, G, becomes negative thus increasing the conductivity between the drain and source terminals and turning the touch operated solid state switch 266 on.

In the circuit diagram of FIG. 9 a touch operated solid state switch 302 is shown incorporating a P channel enhancement MOSFET 304 in an alternative circuit arrangement. The source terminal, S, of the P channel enhancement mode MOSFET 304 is connected to a first switch terminal 306 via leads 308 and 310, and to a resistor 312 via lead 314. The resistor 312 is connected to the +V terminal 316 via leads 318 and 320. The drain terminal D of the P channel enhancement mode MOSFET 304 is connected to a second switch terminal 322 via the lead 324, to contact pad 192 of FIG. 15 which is shown schematically as the rectangle 326 via lead 328 and 330 and to the −V terminal 332 via lead 334.

The gate terminal, G, of the P channel enhancement mode MOSFET 304 is connected to the resistor 336 via the lead 338 and to the contact pad 194 of FIG. 15, which is shown schematically as the rectangle 340, via the lead 342. The resistor 336 is connected to the +V terminal 316 via the lead 344.

In operation, the touch operated solid state switch 302 is normally off, the gate terminal, G, is at a positive potential and there is little or no conductivity between the drain terminal D and the source terminal, S, and consequently, little or no conductivity between the switch terminals 306 and 322. When the contact pads 190 and 192 are touched simultaneously by an operator, the potential on the gate terminal, G, becomes negative thus increasing the conductivity between the drain and source terminals and turning on the touch operated solid state switch 302.

In the circuit diagram of FIG. 10 a normally-on touch operated solid state switch 346 is shown incorporating an N channel depletion mode MOSFET 348. The drain terminal, D, of the N channel depletion mode MOSFET 348 is connected to the +V terminal 350 via lead 352 and 354 and to the contact pad 192 of FIG. 15 which is shown schematically as the rectangle 356 via lead 358. The source terminal, S, of the N channel depletion mode MOSFET 348 is connected to the first switch terminal 359 via the leads 360 and 362. The resistor 364 is connected across the gate terminal, G, and the source terminal, S, of the N channel depletion mode MOSFET 348 via the leads 368 and 370, respectively. The gate terminal, G, is also connected to the contact pad 194 of FIG. 15 which is shown schematically as the rectangle 372 via the lead 374. The −V terminal 376 is connected to the resistor 378 via the lead 380 and the resistor 378 is connected, in turn, to the second switch terminal, 381, via the lead 382.

In operation, the touch operated solid state switch 346 has the switch terminals 359 and 380 connected to a load and is normally on, the gate terminal, G, is at a relatively low potential, and there is conductivity between the switch terminals 359 and 380. When the contact pads 192 and 194 are touched simultaneously by an operator, the potential on the gate terminal, G, becomes positive and the conductivity between the drain terminal, D, and the source terminal, S, decreases and the touch operated solid state switch 346 is turned off.

In the circuit diagram of FIG. 11 a normally-on touch operated solid state switch 382 is shown incorporating a P channel depletion mode MOSFET 384. The source terminal, S, of the P channel depletion mode MOSFET 384 is connected to the +V terminal 386 via leads 388 and 390 and the drain terminal, D, is connected to the first switch terminal 392 via the lead 394. The resistor 396 is connected across the gate terminal, G, and the source terminal, S, of the P channel depletion mode MOSFET 384 via the leads 398 and 400, respectively. The gate terminal, G, is also connected to the contact pad 190 of FIG. 15 which is shown schematically by the rectangle 402 via lead 404. The contact pad 192 of FIG. 15 which is shown schematically by the rectangle 406 is connected to the −V terminal 408 via the leads 410 and 412 and to the resistor 414 via the lead 416. The resistor 414 is connected to the second switch terminal 418 via the lead 420.

In operation, the touch operated solid state switch 382 is normally on, the gate terminal, G, is at a relatively low potential and there is conductivity between the switch terminals 392 and 418. When the contact pads 190 and 192 are touched simultaneously by an operator, the potential on the gate terminal, G, becomes negative and the touch operated solid state switch 382 is turned off.

In each of the above circuits incorporating MOSFETs the substrate of the MOSFET is preferably connected electrically to source terminal, S, of the MOSFET. In the following circuits junction field-effect transistors (JFET's) in incorporated as shown in FIGS. 12, 13 and 14.

In the circuit diagram of FIG. 12 a touch operated solid state switch 422 is shown incorporating an N channel depletion mode JFET 424. The drain terminal of the N channel depletion mode JFET 424 is connected to a first switch terminal 426 via the leads 428 and 430 and to the resistor 432 via the lead 434. The resistor 432 is connected to the +V terminal 436 via the lead 438 and to the contact pad 192 of FIG. 15, which is shown schematically as the rectangle 440, via the lead 442. The source terminal, S, is connected to the second switch terminal 444 via the leads 446 and 448 and to the −V terminal 437 via the leads 446 and 448. The resistor 450 is connected across the gate terminal, G, and the source terminal, S, via the leads 452 and 454, respectively. The gate terminal, G, is also connected to the contact pad 190 of FIG. 15 which is shown schematically by the rectangle 456 via the lead 458.

In operation, the touch operated solid state switch 422 is normally off, the gate terminal, G, is at a negative potential and there is little or no conductivity between the drain terminal, D, and the source terminal, S, and consequently little or no conductivity between the switch terminals 426 and 444. When the contact pads 190 and 192 are touched simultaneously by an operator, the potential on the gate terminal, G, becomes positive, thus increasing the conductivity between the drain and source terminals and turning the touch operated solid state switch 422 on.

In the circuit diagram of FIG. 13 a touch operated solid state switch 460 is shown incorporating a P channel depletion mode JFET 462. The source terminal, S, of the P channel depletion mode JFET 462 is connected to a first switch terminal 464 via the leads 466 and 468 and to a resistor 470 via the lead 472. The resistor 470 is connected to the +V terminal 474 via the lead 476. The resistor 478 is connected across the gate terminal, G, and the source terminal, S, via the leads 479 and 480, respectively and the gate terminal, G, is connected to the contact pad 192 of FIG. 15, which is shown schematically as the rectangle 484, via the lead 486. The drain terminal, D, of the P channel depletion mode JFET 462 is connected to the −V terminal 488 via the leads 490 and 492, to a second switch terminal 494 via the lead 496 and to the contact pad 190 of FIG. 15 which is shown schematically as the rectangle 498 via the lead 500.

In operation, the touch operated solid state switch 460 is normally off, the gate terminal, G, is at a positive potential and there is little or no conductivity between the drain terminal, D, and the source terminal, S, and consequently little or no conductivity between the switch terminals 464 and 494. When the contact pads 190 and 192 are touched simultaneously by an operator, the potential on the gate terminal, G, becomes negative thus increasing the conductivity between the drain and source terminals and turning the touch operated solid state switch 460 on.

In the circuit diagram of FIG. 14 a touch operated solid state switch 502 is shown incorporating a P channel depletion mode JFET 504 in an alternative circuit configuration. The source terminal, S, of the P channel depletion mode JFET 504 is connected to a first switch terminal 506 via the leads 508 and 510 and to the resistor 512 via the lead 514. The resistor 512 is connected to the +V terminal 516 via the lead 518. The gate terminal, G, is connected to the contact pad 192 of FIG. 15, which is shown schematically as the rectangle 520 via lead 522 and to the resistor 524 via the lead 526. The resistor 524 is connected to the +V terminal 516 via the lead 528. The drain terminal, D, of the P channel depletion mode JFET 50 is connected to the second switch terminal 530 via the lead 532 and 534 and to the −V terminal 536 via the lead 538 and to the contact pad 190 of FIG. 15, which is shown schematically as the rectangle 540 via the lead 542.

In operation, the touch operated solid state switch 502 is normally off, the gate terminal, G, is at a positive potential and there is little or no conductivity between the drain terminal, D, and the source terminal, S, and consequently little or no conductivity between the switch terminals 506 and 530. When the contact pads 190 and 192 are touched simultaneously by an operator the potential on the gate terminal, G, becomes negative thus increasing the conductivity between the drain and the source terminals and turning the touch operated solid state switch 502 on.

The touch operated solid state switches shown in FIGS. 7 through 14 have each been described with reference to the contact pads 190 and 192 of FIG. 15. This description has been by way of example only and the contact pads of FIG. 17 or similar contact pads may likewise be utilized. The components required for each of the touch operated solid state switches comprise a field-effect transistor, two resistors, four terminals and the appropriate electrical circuit connections as shown. These components may be packaged in a variety of configurations including mounting the components on the substrate 200 or mounting these components in a container which may be remote from the contact pads 192 and 194. The relatively small number of components required for operation results in a small and efficient miniature package configuration.

FIG. 19 is a circuit diagram of a touch-on, touch-off solid state switch 700, according to the present invention which incorporates an NPN transistor 702 and a silicon controlled rectifier, SCR, 704 and two sets of contacts, 706, 708 and 710, 712. The two sets of contacts 706, 708 and 710, 712 may each be configured in a manner similar to that shown in FIGS. 15 and 17. The terminals of the NPN transistor 702 are denoted in the conventional manner with the letter C indicating the collector terminal, the letter B indicating the base terminal and the letter E indicating the emitter terminal and the terminals of the SCR 704 are also denoted in the conventional manner with the letter A indicating the anode terminal, the letter C indicating the cathode terminal and the letter G indicating the gate terminal.

The contact 706 is connected to base of the NPN transistor 702 via the lead 714 and a resistor 716 is connected between the contact 706 and the collector of the NPN transistor 702. This resistor 716 may have, by way of example only, a value in the order of one meg ohm. The collector of the NPN transistor 702 is connected to the contact 710 via the lead 718 and to the positive terminal of a battery 720 via the lead 722. The negative terminal of the battery 720 is connected to the contact 708 via the lead 724 and the emitter of the NPN transistor 702 is connected to the anode of the SCR 704 via the lead 726. The lead 728 connects the gate of the SCR 704 to the contact 712. The cathode of the SCR 704 is connected to the terminal 730 via the lead 732 and the contact 708 is connected to the terminal 734 via the lead 736.

In operation, the NPN transistor 702 is held in the on state by a positive level applied through the resistor 716. The SCR 704 is normally off. To turn the touch-on, touch-off switch 700 on a user touches contacts 710 and 712 with a finger. The low resistance of the user's finger applies a positive pulse to the gate of the SCR 704 turning it on. Once this is done the touch-on, touch-off switch 700 stays on and a device connected to the terminals 730 and 734 receives the voltage produced by the battery 720. The touch-on, touch-off switch 700 remains on until the user touches contacts 706 and 708. The low resistance of the user's finger placed across contacts 706 and 708 applies a negative pulse which turns the NPN transistor 702 off thus turning the SCR 704 off since an SCR will turn off when its anode to cathode current is interrupted. The SCR 704 is turned off when the anode to cathode current is broken by the NPN transistor 702. When the user's finger is removed from the contacts 706 and 708 the NPN transistor 702 is turned on thus resetting the touch-on, touch-off switch 700.

Figure 20:
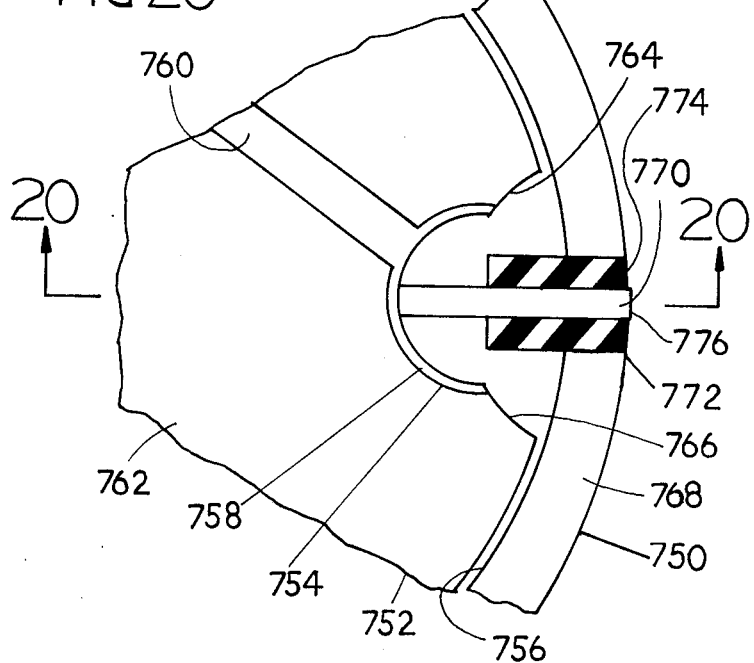
FIG. 20 is an enlarged fragmentary plan view taken similar to FIG. 1 showing an alternative solid state switch contact which may be used with the solid state switch configuration shown in FIG. 1.

FIG. 20 shows an alternative solid state switch contact 750 which may be incorporated in the digital watch shown in FIG. 1. The alternative solid state switch contact 750 incorporates a printed circuit board 752 having a semi-circular recess 754 formed on the edge 756 of the printed circuit board 752. The semi-circular recess 754 has a plated conductive layer 758 formed on the edge 756 of the printed circuit board 752 and at least one of the circuit paths 760 on the surface 762 of the printed circuit 752 board extends to and is in electrical contact with this plated layer 758. The printed circuit board 752 has a pair of surfaces 764 and 766 adjacent the semi-circular recess 754 which have been machined into a generally outwardly flared configuration and are free of plating. When the printed circuit 752 board is inserted into a case 768, the plated layer 758 does not make unwanted electrical contact with the case 768. The solid state switch contact 750 includes a contact rod 770, which projects from the semi-circular recess 754 and which is connected electrically to the plated layer 758 by means of solder 771. The contact rod 770 projects through an aperture 772 in the case 768 and includes an insulating sleeve 774 which prevents unwanted electical contact between the contact rod 770 and the case 768. The insulating sleeve 774 may be made of a resilient material which in addition to having electrical insulating properties also serves to seal the interior of the case 768 against the entrance of moisture through the aperture 772. The end 776 of the contact rod 770 is left free for contact by the finger of a user, thus completing a circuit path between the contact rod 770 and the digital watch case 768 in a manner similar to that shown in FIG. 1.

Figure 22:
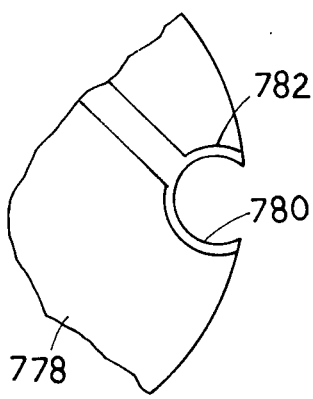
FIG. 22 is a fragmentary plan view of the printed circuit board of FIG. 19 shown at the stage of manufacture immediately after plating of the recess formed on the edge of the board.
Figure 21:
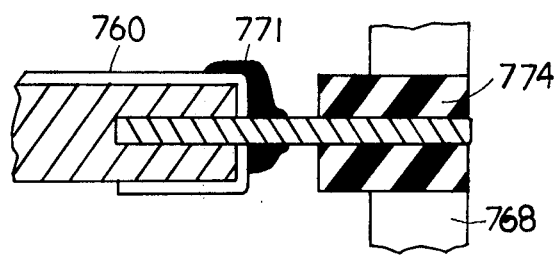
FIG. 21 is a cross-sectional view taken along the line 20—20 in FIG. 19.
Figure 23:
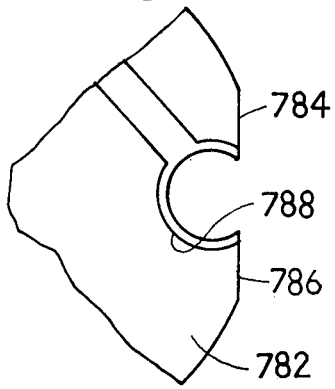
FIG. 23 is a gragmentary plan view of the printed circuit board of FIG. 19 at a later stage of manufacture in which surfaces of the printed circuit board adjacent the recess have been machined.
Figure 24:
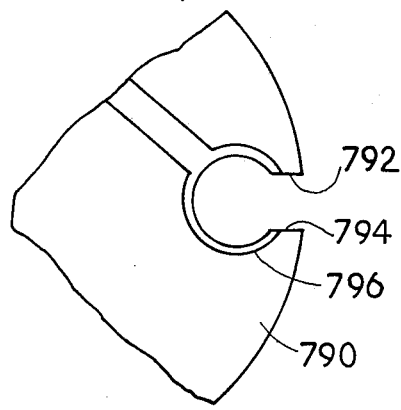
FIG. 24 is a fragmentary plan view of the printed circuit board of FIG. 22 at a stage of manufacture similar to that shown in FIG. 23 showing an alternative machined configuration.

FIG. 22 shows a printed circuit board 778 at the stage of manufacture immediately after plating the edge 780 of the printed circuit board within the recess 782. FIG. 23 shows a printed circuit board 782 with the surfaces 784 and 786 adjacent the recess formed generally in line, and FIG. 24 shows a printed circuit board 790 with the surfaces 792 and 794 adjacent the recess 796 formed generally parallel. FIGS. 23 and 24 are examples of alternative printed circuit board configurations each of which have the essential features of the removal of a small portion of the printed circuit board adjacent the edges of the plated layer in the recess to prevent unwanted contact between the plated conductive layer and the inside of the case.

FIG. 25 shows an alternative touch switch circuit 800 feturing the use of a pair of NPN transistors 802, 804 which are connected with their collectors connected together and the emitter of the first NPN transistor 802 connected to the base of the second NPN transistor 804 in an arrangement conventionally known as a Darlington connection. The touch pad 806 is connected to the base of the first NPN transistor 802 via the lead 808. The emitter of the second NPN transistor 804 is connected to the demand pad 810 of the integrated circuit watch chip 812 via lead 814. The negative terminal of the battery 816 is connected to the negative pad 818 of the integrated circuit watch chip 812 via the lead 820 and the positive terminal of the battery 816 is connected to the collectors of the NPN transistors 802 and 804 via leads 822 and 824 and to the second touch paid via lead 828. The touch switch circuit 800 of FIG. 25 has the advantage of relatively great sensitivity resulting from the arrangement of the NPN transistors 802 and 804 in the Darlington connection acting as an amplifier within the circuit. It is clear that a pair of NPN transistors packaged in a single case in a commercially available Darlington amplifier may be utilized in the touch switch circuit 800 of FIG. 25.

FIG. 26 shows another alternative touch switch circuit 830 which identical to the touch switch circuit 800 of FIG. 25 with the exception that a resistor 832 is provided betweeen the base of the NPN transistor 834 and the negative terminal of the battery 836. The resistance value of the resistor 832 may be selected in order to vary the sensitivity of the touch switch circuit 830, with relatively large values of resistance resulting in a touch switch of relatively greater sensitivity and relatively small values of resistance resulting in a touch switch of relatively lesser sensitivity.

It is clear that the touch switch circuits 800 and 830 of FIGS. 25 and 26 may be used in a wide variety of applications other than the application shown, which is related to the digital watch, by substituting the device or circuit to be turned on for the integrated circuit watch chip 812, which is shown.

In an alternative construction, which is not shown, the touch pad assembly of FIG. 2 which is disposed at a location corresponding to approximately 3 o'clock when the digital watch 12 is viewed, as in FIG. 1, is moved to a location corresponding to approximately 2 p'clock. This alternate construction has the advantage of making it difficult for a user to turn the digital watch 12 on inadvertently, by flexing his wrist and thereby causing a portion of his hand to make contact with the touch pad. In addition, it has been found that this alternate construction is especially convenient for the user since his wrist need not be turned outwardly to permit a finger to be placed on the touch pad.

While preferred embodiments of the invention have been shown and described herein, it is obvious that numerous additions, changes and omissions may be made in such embodiments without departing from the spirit and scope of the invention.

What is claimed is:

1. A touch-on, touch-off solid state switch comprising a case, a first pair of contacts mounted on said case, a second pair of contacts mounted on said case, a pair of switch terminals mounted on said case, transistor means having an on-state an an off-state mounted in said case, silicon controlled rectifier means having an on-state and an off-state mounted in said case, a direct current power source mounted in said case and circuit connection means connecting said first pair of contacts, said second pair of contacts, said pair of switchterminals, said transistor means, said silicon controlled rectifier means and said direct current power source, with said silicon controlled rectifier means in a normally off, non-conducting, state and with said transistor means held in a normally on, conducting, state by said circuit connection means causing the application of positive voltage to the base of said transistor means from said direct current power sources and with said circuit connection means connecting a first contact of said first set of contacts to said direct current power source and connecting a second contact of said first pair of contacts to the gate of said silicon controlled rectifier means for application of a positive voltage to said gate responsive to a user placing a finger across said first set of contacts, turning said silicon controlled rectifier means, on with said circuit connection means providing a current path passing through said silicon controlled rectifier means and passing through said transistor means from said switch terminals to said direct current power source and, with said circuit connecttion means causing the base of said transistor means to receive negative voltage causing it to turn off, and interrupt said current pathresponsive to a user placing a finger across said second set of contacts.

2. A touch-on, touch-off solid state switch according to claim 1 in which said transistor means comprises an NPN transistor.

* * * * *